(12) United States Patent
Ross et al.

(10) Patent No.: US 9,820,409 B1
(45) Date of Patent: Nov. 14, 2017

(54) RACK COOLING SYSTEM

(71) Applicant: Amazon Technologies, Inc., Seattle, WA (US)

(72) Inventors: Peter George Ross, Olympia, WA (US); Christopher Strickland Beall, Woodinville, WA (US); Felipe Enrique Ortega Gutierrez, Tacoma, WA (US); Darin Lee Frink, Lake Tapps, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/868,280

(22) Filed: Sep. 28, 2015

(51) Int. Cl.
*G05B 21/00* (2006.01)
*H05K 7/20* (2006.01)

(52) U.S. Cl.
CPC ................. *H05K 7/20718* (2013.01)

(58) Field of Classification Search
CPC ........... H05K 7/20836; H05K 7/20718; H05K 7/20736; H05K 7/20209; H05K 7/20727; H05K 7/207; G06F 1/206; G06F 1/20; F25D 2700/12
See application file for complete search history.

(56) References Cited

U.S. PATENT DOCUMENTS

| | | | | |
|---|---|---|---|---|
| 4,085,594 A * | 4/1978 | Mayer | ................ | F04D 27/004 236/1 E |
| 6,398,505 B1 * | 6/2002 | Sekiguchi | ............ | F04D 25/166 361/695 |
| 6,463,891 B2 * | 10/2002 | Algrain | ................ | F01P 3/18 123/41.12 |
| 6,791,836 B2 * | 9/2004 | Cipolla | ................ | G06F 9/52 165/80.3 |
| 6,801,004 B2 * | 10/2004 | Frankel | ................ | H02P 6/08 318/268 |
| 6,954,684 B2 * | 10/2005 | Frankel | ............ | G05D 23/1902 361/695 |
| 7,039,539 B2 * | 5/2006 | Espinoza-Ibarra | ... | G06F 13/409 702/182 |

(Continued)

OTHER PUBLICATIONS

U.S. Appl. No. 14/876,597, filed Oct. 6, 2015, Frink, et al.

(Continued)

*Primary Examiner* — Darrin Dunn
(74) *Attorney, Agent, or Firm* — Robert C. Kowert; Meyertons, Hood, Kivlin, Kowert & Goetzel, P.C.

(57) ABSTRACT

A rack cooling system includes a plurality of electronic devices mounted in a rack and a plurality of shared rack-level fans arranged in an array and coupled to a rack. A fan controller receives one or more condition signals indicating thermal conditions in the electronic devices and generates a plurality of control signals for controlling the shared rack-level fans. The fan controller generates the plurality of control signals based on respective thermal conditions in respective electronic devices in respective positions in the rack and the plurality of control signals causes different respective groups of one or more shared rack-level fans in different locations in the array to induce air flow through the electronic devices, wherein separate ones of the two or more groups of one or more shared rack-level fans operate at different speeds or angles.

20 Claims, 9 Drawing Sheets

(56) References Cited

U.S. PATENT DOCUMENTS

| | | | | |
|---|---|---|---|---|
| 7,096,147 B1* | 8/2006 | Low | G01R 31/2817 | 702/132 |
| 7,142,125 B2* | 11/2006 | Larson | F04D 27/004 | 310/52 |
| 7,194,645 B2* | 3/2007 | Bieswanger | G06F 1/206 | 340/584 |
| 7,526,400 B2* | 4/2009 | Harper | G01K 7/42 | 700/278 |
| 7,676,302 B2* | 3/2010 | Frankel | G05D 23/1917 | 700/300 |
| 7,711,659 B2* | 5/2010 | de la Guardia | G06F 1/206 | 706/1 |
| 7,714,524 B2* | 5/2010 | Frankel | H02P 5/68 | 318/266 |
| 7,869,210 B2* | 1/2011 | Moss | H05K 7/20836 | 361/694 |
| 8,554,389 B2* | 10/2013 | Cox | G06F 1/203 | 320/144 |
| 8,630,724 B2* | 1/2014 | Hamann | G05B 13/04 | 700/12 |
| 8,630,967 B2* | 1/2014 | Sharma | H05K 7/20836 | 706/26 |
| 8,749,187 B2* | 6/2014 | Busch | G06F 1/206 | 318/461 |
| 8,751,057 B2* | 6/2014 | Tan | G05D 23/1919 | 700/276 |
| 8,805,590 B2* | 8/2014 | Bahali | G05D 23/1934 | 700/19 |
| 8,936,443 B2* | 1/2015 | Mashak | F04D 27/001 | 361/679.5 |
| 9,014,870 B2* | 4/2015 | Chiu | H05K 7/1497 | 700/299 |
| 9,020,656 B2* | 4/2015 | Shelnutt | G06F 1/206 | 700/299 |
| 9,122,462 B2* | 9/2015 | Ross | H05K 7/20727 | |
| 9,125,326 B1* | 9/2015 | Eichelberg | H05K 7/20736 | |
| 9,136,779 B2* | 9/2015 | Busch | H02P 1/04 | |
| 9,279,597 B1* | 3/2016 | Lee | F24F 11/053 | |
| 2003/0234624 A1* | 12/2003 | Frankel | H02P 6/08 | 318/268 |
| 2005/0259395 A1* | 11/2005 | Espinoza-Ibarra | H05K 7/20836 | 361/695 |
| 2006/0178764 A1* | 8/2006 | Bieswanger | G06F 1/206 | 700/89 |
| 2006/0232231 A1* | 10/2006 | Chen | G06F 1/206 | 318/66 |
| 2007/0142976 A1* | 6/2007 | Tezuka | G05D 23/19 | 700/300 |
| 2008/0036403 A1* | 2/2008 | Ma | F04D 25/166 | 318/49 |
| 2008/0059003 A1* | 3/2008 | Doberstein | F25D 29/008 | 700/300 |
| 2008/0237361 A1* | 10/2008 | Wang | F24F 11/0079 | 236/49.3 |
| 2008/0279677 A1* | 11/2008 | Hopkins | F04D 25/166 | 415/51 |
| 2008/0313492 A1* | 12/2008 | Hansen | G06F 1/206 | 714/5.11 |
| 2009/0002939 A1* | 1/2009 | Baugh | G06F 1/206 | 361/679.48 |
| 2009/0164811 A1* | 6/2009 | Sharma | G06F 1/206 | 713/310 |
| 2009/0204270 A1* | 8/2009 | Garcia | G05D 23/1934 | 700/300 |
| 2009/0265045 A1* | 10/2009 | Coxe, III | H05K 7/20836 | 700/300 |
| 2009/0299543 A1* | 12/2009 | Cox | G06F 1/203 | 700/299 |
| 2009/0308579 A1* | 12/2009 | Johnson | H05K 7/20836 | 165/104.34 |
| 2010/0094582 A1* | 4/2010 | Cox | G01K 7/42 | 702/130 |
| 2010/0299099 A1* | 11/2010 | Yamaoka | F24F 11/0001 | 702/130 |
| 2010/0315223 A1* | 12/2010 | Gross | G05B 13/048 | 340/500 |
| 2011/0228471 A1* | 9/2011 | Humphrey | F04D 27/004 | 361/679.48 |
| 2011/0301778 A1* | 12/2011 | Liang | G05D 23/1932 | 700/299 |
| 2011/0320062 A1* | 12/2011 | Tan | G06F 1/206 | 700/300 |
| 2012/0035783 A1* | 2/2012 | Chou | G06F 1/206 | 700/300 |
| 2012/0065808 A1* | 3/2012 | Liu | G06F 1/206 | 700/300 |
| 2012/0158387 A1* | 6/2012 | VanGilder | G06F 17/5009 | 703/9 |
| 2012/0215359 A1* | 8/2012 | Michael | G06F 1/206 | 700/275 |
| 2012/0215373 A1* | 8/2012 | Koblenz | G05D 23/1919 | 700/300 |
| 2012/0244015 A1* | 9/2012 | Benson | F04D 29/601 | 417/53 |
| 2012/0284216 A1* | 11/2012 | Hamann | G06F 1/206 | 706/12 |
| 2012/0287571 A1* | 11/2012 | Santos | G06F 1/20 | 361/679.48 |
| 2013/0096720 A1* | 4/2013 | Brey | G06F 1/3206 | 700/276 |
| 2013/0130609 A1* | 5/2013 | Chen | H05K 7/20836 | 454/184 |
| 2013/0135819 A1* | 5/2013 | Wang | H04L 41/00 | 361/679.48 |
| 2013/0158713 A1* | 6/2013 | Geissler | G05D 23/1932 | 700/275 |
| 2013/0158738 A1* | 6/2013 | Chen | G05D 23/1932 | 700/300 |
| 2013/0188309 A1* | 7/2013 | Ross | H05K 7/20727 | 361/679.48 |
| 2013/0197895 A1* | 8/2013 | Wang | G06F 1/206 | 703/21 |
| 2013/0261826 A1* | 10/2013 | Mandagere | G06F 1/3203 | 700/291 |
| 2014/0025208 A1* | 1/2014 | Allen-Ware | G06F 11/2023 | 700/276 |
| 2014/0049905 A1* | 2/2014 | Manzer | H05K 7/20836 | 361/679.46 |
| 2014/0074261 A1* | 3/2014 | Wang | G06F 1/00 | 700/90 |
| 2014/0094986 A1* | 4/2014 | Lin | G05D 23/1934 | 700/300 |
| 2014/0100709 A1* | 4/2014 | Sakurai | G05D 23/19 | 700/300 |
| 2014/0117906 A1* | 5/2014 | Busch | G06F 1/206 | 318/471 |
| 2014/0118926 A1* | 5/2014 | Santos | G06F 1/20 | 361/679.48 |
| 2014/0151003 A1* | 6/2014 | Chapel | H05K 7/20745 | 165/154 |
| 2014/0188434 A1* | 7/2014 | Steinbrecher | H05K 7/20836 | 702/184 |
| 2014/0277750 A1* | 9/2014 | Artman | G05B 15/02 | 700/275 |
| 2014/0277818 A1* | 9/2014 | Peterson | G06F 1/206 | 700/300 |
| 2014/0337256 A1* | 11/2014 | Varadi | G05B 13/04 | 706/12 |
| 2014/0355201 A1* | 12/2014 | Alshinnawi | H05K 7/20736 | 361/679.47 |
| 2014/0362526 A1* | 12/2014 | Wang | H05K 7/20836 | 361/679.48 |
| 2015/0030469 A1* | 1/2015 | Hopkins | F04D 25/166 | 417/53 |
| 2015/0100297 A1* | 4/2015 | Singh | G06Q 10/06 | 703/21 |

(56) References Cited

U.S. PATENT DOCUMENTS

| | | | | |
|---|---|---|---|---|
| 2015/0134123 A1* | 5/2015 | Obinelo | ............... | G05B 15/02 |
| | | | | 700/277 |
| 2015/0177750 A1* | 6/2015 | Bailey | ............... | H05K 7/20736 |
| | | | | 700/275 |
| 2015/0184883 A1* | 7/2015 | Hamann | ............... | G05B 15/02 |
| | | | | 700/277 |
| 2015/0286259 A1* | 10/2015 | Ermenko | ............... | G06F 1/203 |
| | | | | 700/300 |
| 2015/0373881 A1* | 12/2015 | Ross | ............... | H05K 7/20727 |
| | | | | 361/679.51 |
| 2015/0378404 A1* | 12/2015 | Ogawa | ............... | G06F 1/206 |
| | | | | 700/300 |
| 2015/0378414 A1* | 12/2015 | Kato | ............... | G06F 1/20 |
| | | | | 713/340 |
| 2016/0011607 A1* | 1/2016 | James | ............... | G05B 15/02 |
| | | | | 700/300 |
| 2016/0037686 A1* | 2/2016 | Shabbir | ............... | G05D 23/19 |
| | | | | 700/300 |
| 2016/0062340 A1* | 3/2016 | Ogawa | ............... | G05B 19/404 |
| | | | | 700/299 |
| 2016/0120072 A1* | 4/2016 | Boegner | ............... | H05K 7/20736 |
| | | | | 165/247 |

OTHER PUBLICATIONS

U.S. Appl. No. 14/876,602, filed Oct. 6, 2015, Peter G. Ross, et al.
Intertek, "Instruction Sheet for FC-2-215-1C," Middle Atlantic Products, Rev D, pp. 1-4, downloaded from http://images2.cableorganizer.com/midatlantic/fc-fan-control-units/FC-2-215-1C.pdf on Sep. 12, 2015.

* cited by examiner

RACK COOLING SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computing systems typically include a number of components that generate waste heat. Such components include printed circuit boards, mass storage devices, power supplies, and processors. For example, some computers with multiple processors may generate 250 watts of waste heat. Some known computing systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Computing systems mounted in a rack may include one or more fans mounted in individual computing systems to cool components of the computing systems. Such arrangements may lead to inefficiencies because the computing systems include a large number of relatively small fans that are inefficient when compared to larger fans. Some racks may include larger rack-level fans used to cool computer systems mounted in the racks. In some racks, rack-level fans may be controlled based on rack-level inputs without regard to temperature variations between computing devices mounted in the rack. In some control arrangements control of rack-level fans may not allow different ones of the rack-level fans to operate at different speeds. Such arrangements may lead to inefficiencies in cooling computing systems mounted in a rack. For example, the rack-level fans may provide surplus cooling to computer systems in the rack that are operating at lower temperatures than other computer systems in the rack that are operating at hotter temperatures. In another example, the rack-level fans may provide adequate cooling to computer systems operating under normal conditions and temperatures but not provide adequate cooling to computer systems that are operating at higher temperatures.

Figure 1:
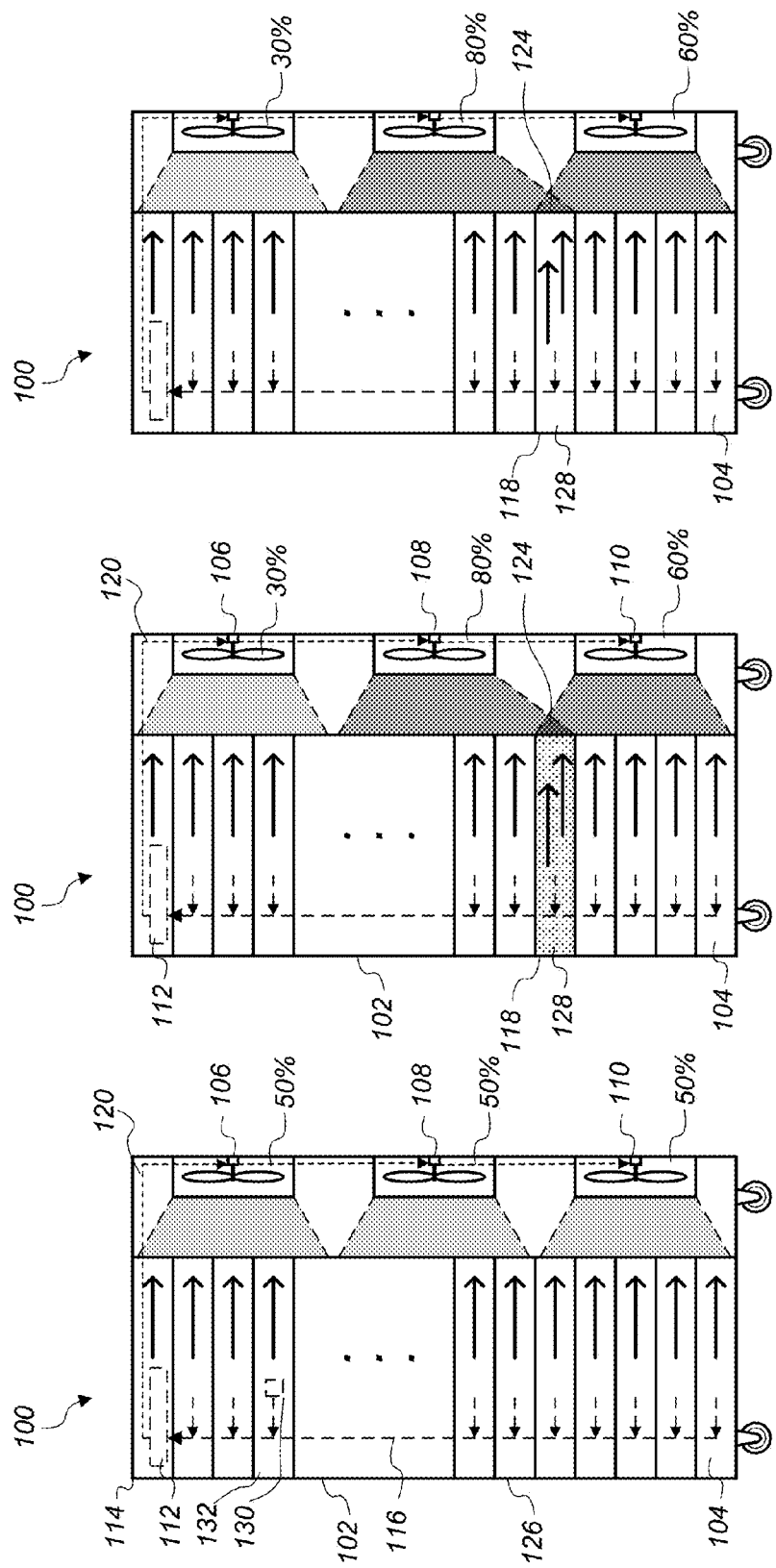
FIG. 1A illustrates a side view of a rack, a plurality of electronic devices mounted in the rack and a plurality of shared fans coupled to the rack, according to some embodiments.
FIG. 1B illustrates a side view of a rack, a plurality of electronic devices mounted in the rack and a plurality of shared fans coupled to the rack, according to some embodiments.
FIG. 1C illustrates a side view of a rack, a plurality of electronic devices mounted in the rack and a plurality of shared fans coupled to the rack, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of rack cooling systems, and systems and methods for utilizing rack cooling systems, are disclosed. According to one embodiment a rack cooling system includes a plurality of electronic devices mounted in a rack, a plurality of shared fans arranged in an array and coupled to the rack, and a fan controller. For example, the plurality of shared fans arranged in the array may include columns and rows with multiple fans in each row and column, for example the fans may be arranged in a 2×3 array, a 7×6 array, or an array with other combinations of shared fans. Continuing the example, the shared fans arranged in the array may be coupled to a traditional 19" rack and provide cooling to multiple groups of electronic devices mounted in the rack, such as multiple servers, mounted in a standard 19" rack. The fan controller included in the rack cooling system is configured to receive one or more condition signals indicating thermal conditions in two or more different groups of one or more electronic devices, wherein each group of the two or more groups of different groups of one or more electronic devices is associated with a respective position in the rack. The fan controller is further configured to access a fan speed control model and generate a plurality of control signals for controlling two or more different groups of one or more shared fans, wherein each of the two or more different respective groups of one or more shared fans is associated with a respective location in the array, and wherein at least some of the plurality of control signals command the shared fans of separate ones of the two or more different respective groups of one or more shared fans to operate at different speeds. The fan controller is further configured to generate the plurality of control signals based, at least in part, on respective thermal conditions in two or more different groups of one or more electronic devices and their respective positions in the rack, and one or more relationships included in the fan speed control model between the respective positions in the rack associated with the two or more different respective groups of one or more electronic devices and the respective locations in the array associated with the two or more different respective groups of one or more shared fans. For example, a fan controller may receive one or more condition signals indicating different temperatures in different servers mounted in a standard 19" rack, and the fan controller may generate multiple control signals for controlling respective groups of one or more shared fans arranged in different respective locations in an array of shared fans coupled to a rack such that the control signals command the respective groups of one or more shared fans in different respective locations in the array to operate at different speeds. The operation of the different shared fans at different speeds may result in different air flows from the shared fans flowing through different servers in different positions in the rack that are indicated to be operating at different temperatures.

According to one embodiment, a method includes receiving one or more condition signals relating to thermal conditions in two or more different groups of one or more electronic devices mounted in a rack, wherein each respective group of the two or more different groups of one or more electronic devices is associated with a respective position in the rack. The method also includes generating a plurality of control signals for controlling a plurality of shared fans arranged in an array and coupled to the rack, wherein the plurality of shared fans comprises two or more different groups of one or more shared fans each associated with a respective location in the array, wherein each respective group of the two or more different groups of one or more shared fans are configured to provide cooling to more than one respective group of the two or more different groups of one or more electronic devices, wherein the plurality of control signals are generated based, at least in part, on respective thermal conditions in two or more respective different groups of one or more electronic devices of the two or more different groups of the one or more electronic devices; and respective positions in the rack associated with the two or more respective different groups of one or more electronics devices. The method also includes inducing, by the two or more groups of one or more shared fans, air flow through the two or more different groups of one or more electronic devices mounted in the rack, wherein at least some of the plurality of control signals command the shared fans of separate ones of the two or more different groups of one or more shared fans to operate at different speeds.

According to one embodiment, a non-transitory computer-readable storage medium stores program instructions, that when executed on one or more computing devices cause the one or more computing devices to receive one or more condition signals relating to thermal conditions in two or more different groups of one or more electronic devices mounted in a rack, wherein each respective group of the two or more different groups of one or more electronic devices is associated with a respective position in the rack. The program instructions also cause the one or more computing devices, when executed on the one or more computing devices, to generate a plurality of control signals for controlling a plurality of shared fans arranged in an array and coupled to the rack, wherein the plurality of shared fans comprises two or more different groups of one or more shared fans each associated with a respective location in the array, wherein each respective group of the two or more different groups of one or more shared fans are configured to provide cooling to more than one respective group of the two or more different groups of one or more electronic devices, wherein the plurality of control signals are generated based, at least in part, on respective thermal conditions in two or more respective different groups of one or more electronic devices of the two or more different groups of the one or more electronic devices; and respective positions in the rack associated with the two or more respective different groups of one or more electronics devices, wherein the two or more groups of one or more shared fans are configured to induce air flow through the two or more different groups of one or more electronic devices mounted in the rack, wherein at least some of the plurality of control signals command the shared fans of separate ones of the two or more different groups of one or more shared fans to operate at different speeds.

As used herein, "air moving device" includes any device, element, system, or combination thereof that can move air. Examples of air moving devices include fans, blowers, and compressed air systems.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" or "computing system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, a "rack" means a rack, container, frame, or other element or combination of elements that can contain or physically support one or more computer systems.

As used herein, a "space" means a space, area or volume.

As used herein, a "slot" means a space in a rack configured to accept a device that is to be installed in the rack. Examples of a slot in a rack include a shelf in a rack on which computing devices can be mounted or a pair of rails in a rack on which computing devices can be mounted.

In some embodiments, various electronic devices are mounted in a rack such as separate computer systems, devices, etc. mounted in a rack. Such separate computer systems, devices, etc. may include heat-producing components cooled via airflows through a rack. Such separate computer systems, devices, etc. can include one or more data storage modules, data control modules, etc. In some embodiments, each of the data storage modules and data control modules in a rack may include one or more heat producing components. Such separate computer systems, devices, etc. may include data processing modules, network devices, etc. In some embodiments, each of the processing modules or network devices may include heat producing components, such as processors, switches, etc.

In some embodiments, one or more shared air moving devices may direct an airflow through one or more of the electronic devices mounted in a rack to remove heat from heat producing components of the electronic devices mounted in the rack. Air moving devices mounted in individual electronic devices in a rack, such as fans mounted within individual computer systems, may be less efficient at cooling the individual computer systems than larger shared air moving devices used to cool multiple computer systems or multiple electronic devices mounted in a rack. For example, shared air moving devices may include shared rack-level fans and motors that cause an equivalent amount of airflow as multiple smaller air moving devices mounted in individual electronic devices to flow through the multiple electronic devices while consuming less energy than the multiple smaller air moving devices.

Electronic devices mounted in a rack may generate varying amounts of waste heat. For example, a particular computer system mounted in a rack may experience a high processing load that causes the computer system to generate a large amount of waste heat while another computer system mounted in the same rack may be experiencing a minimal processing load. The amount of waste heat generated by the other computer system may be considerably less than the amount of waste heat generated by the particular computer system. Shared rack-level air moving devices, such as shared rack-level fans, that supply a shared air flow to the particular computer system and the other computer system may be controlled such that an amount of airflow generated by the shared rack-level air moving devices provides sufficient cooling to the particular computer system experiencing the high processing load, but supplies more airflow than is necessary to cool the other computer system experiencing the minimal processing load. The surplus airflow supplied to the other computer system experiencing the minimal load may lead to wasted energy because energy is consumed by the shared rack-level air moving devices to generate the surplus airflow even though the surplus airflow is not necessary to cool the other computer system.

Greater efficiencies may be realized by generating a plurality of respective control signals for controlling different ones of respective shared rack-level air moving devices coupled to a rack, wherein the plurality of control signals are based on different thermal conditions in different ones of the electronic devices mounted in the rack and the positions in the rack of the different electronic devices experiencing the different thermal conditions. The plurality of control signals may command shared rack-level air moving devices to operate at different respective speeds such that the shared rack-level air moving devices induce different amounts of airflow through different ones of the electronic devices mounted in the rack experiencing different thermal conditions, in accordance with the plurality of control signals. Thus an amount of airflow induced through a particular electronic device mounted in a rack by a shared rack-level air moving device may be adjusted based on thermal conditions in the particular electronic device and a position in the rack of the particular electronic device. Thus, cooling may be provided to electronic devices mounted in a rack in an efficient manner such that the electronic devices receive adequate cooling while reducing surplus cooling supplied to electronic devices mounted in the rack and therefore reducing wasted energy.

FIGS. 1A-1C illustrate a rack cooling system with an array of shared fans operating according to a plurality of control signals generated based on different thermal conditions in different electronic devices located in different positions in a rack, according to some embodiments.

Figure 2:
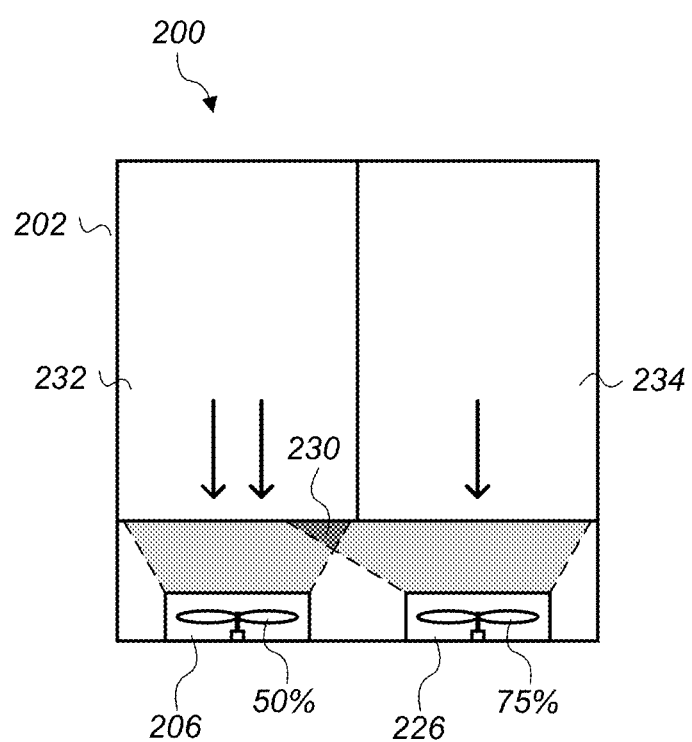
FIG. 2 illustrates a top view of a rack, a plurality of electronic devices mounted in the rack and a plurality of shared fans coupled to the rack, according to some embodiments.

As shown in FIG. 1A, a rack cooling system, such as rack cooling system 100, includes a rack such as rack 102, a plurality of electronic devices mounted in the rack, such as electronic devices 104 mounted in rack 102, a plurality of shared fans arranged in an array and coupled to the rack, such as shared fans 106, 108, and 110 arranged in an array and coupled to rack 102 (note FIGS. 1A-1C are a side view of a rack cooling system and a rack cooling system may include multiple fans in a row of fans such as illustrated in FIG. 2), and a fan controller, such as fan controller 112 implemented on electronic device 114 of electronic devices 104 mounted in rack 102. In some embodiments, electronic devices 104 may be servers, and fan controller 112 may be implemented on one of the servers. As discussed in more detail below, in some embodiments, a fan controller may be implemented in other ways, such as being implemented on a programmable logic controller (PLC).

A fan controller, such as fan controller 112, may be configured to receive condition signals indicating thermal conditions in two or more groups of one or more electronic devices mounted in a rack. For example, fan controller 112 may receive condition signals 116 indicating thermal conditions in electronic devices 104. In some embodiments, the conditional signals may include address information such that the fan controller is able to determine which electronic device or group of electronic devices sent a particular condition signal. The fan controller may access information that indicates locations in the rack of particular electronic devices or groups of electronic devices corresponding to the address information. In some embodiments a condition signal may be received by a fan controller over a particular connection, wherein the connection indicates a position in the rack of an electronic device sending the condition signal or a group of electronic devices sending the condition signal. In some embodiments, a fan controller may use other techniques to determine a position in a rack associated with an electronic device or group of electronic devices for which condition signals are received.

In some embodiments, a condition signal indicating thermal conditions in an electronic device or a group of electronic devices, may be generated via a virtual sensor. A virtual sensor, such as virtual sensor 130, may be configured to generate condition signals indicating thermal conditions in an electronic device based, at least in part, on relationships between other values measured in regard to the electronic device. For example, a virtual sensor, such as virtual sensor 130, may be configured to indicate a temperature within a server, such as server 132, based on a relationship between processor utilization of the server and temperature of the server, such that the virtual sensor uses information describing processor utilization to generate a condition signal indicating a temperature of the server. In another example, a virtual sensor may use a processor utilization measurement, and a temperature measurement, and one or more other measurements to generate a condition signal indicating a flow rate of air through an electronic device. In some embodiments, other values measured in regard to an electronic device may be used by a virtual sensor to indicate a thermal condition in an electronic device. For example, in some embodiments virtual sensors may indicate, temperature, air pressure, air flow rate, an amount of waste heat to be removed from an electronic device, and other like thermal conditions related to an electronic device based on non-thermal measurements.

A fan controller, such as fan controller 112, may be configured to generate a plurality of control signals based on the one or more thermal conditions in the electronic devices, the positions in the rack associated with the electronic devices, and a fan control model that describes relationships between control signal values for controlling the plurality of shared fans and corresponding performance values for the plurality of shared fans. In some embodiments, a fan control model may include a model that includes fan speeds, fan angles, and/or both fan speeds and fan angles. For example, fan controller 112 may generate control signals 120 for controlling shared fans 106, 108, and 110 based on indicated thermal conditions in electronic devices 104 mounted in rack 102, positions in rack 102 of the electronic devices 104, and a fan control model for shared fans 106, 108, and 110 coupled to rack 102. The performance values included in a fan control model for a plurality of shared fans coupled to a rack may correspond to capacities of the shared fans to remove thermal energy from particular electronic devices mounted in particular positions in the rack when the shared fans are operated in accordance with the control signal values, for example in accordance with control signal values commanding the fans to operate at a particular speed and to be oriented at a particular angle. In some embodiments, a fan control model may include performance values for each position in a rack or, in some embodiments, a fan control model may include performance information for a portion of multiple positions in a rack, such as a group of one or more electronic devices. A fan controller may interpolate and/or use other methods to determine performance information for rack positions between rack positions included in a fan control model. In some embodiments, performance values may include a rate of heat removal from an electronic device, a flowrate of air through an electronic device, a processor load of an electronic device that can be cooled without temperature rise, or other values that correspond with a capacity of a plurality of shared fans to remove thermal energy from particular electronic devices mounted in particular positions in a rack when the plurality of fans are operated in accordance with a set of control signal values (e.g. at a commanded speed and/or angle).

In some embodiments, a fan control model may include sets of control signal values and corresponding sets of performance values. A fan controller may be configured to determine a similarity between current thermal conditions indicated in particular electronic devices in particular positions in a rack and stored performance values for a plurality of shared fans coupled to a rack. The fan controller may determine that a particular set of performance values indicates the shared fans when operated according to the set of control signal values that correspond to the particular set of performance values will have the capacity to remove thermal energy from electronic devices while minimizing surplus air flow supplied to the electronic devices. When a closely matching set of performance values are identified for current thermal conditions indicated in the particular electronic devices in the particular locations in the rack, the fan controller may generate control signals for controlling the plurality of fans coupled to the rack in accordance with the control signal values that correspond to the closely matching set of performance values.

In some embodiments, a fan control model may be organized in other ways. For example, a fan control model may be organized based on an amount of thermal energy that can be removed from a particular position in a rack. For example, for a particular position in a rack a fan control model may include a range of amounts of thermal energy that can be removed from the particular position in the rack when a plurality of shared fans coupled to a rack are operated in accordance with different sets of control signal values. A fan controller may determine a particular position in a rack to be a dominant control position, for example a fan controller may select position 126 as a dominant position for control, and determine based on thermal conditions indicated in the dominant position, such as position 126, an amount of thermal energy to be removed from that position. The fan controller may then determine a closely matching performance value and operate the plurality of fans in accordance with a set of control signal values that correspond to the closely matching performance value. For example, a fan controller may determine based on indicated thermal conditions in an electronic device in position 126 that 10 watts of thermal energy are to be removed from the electronic device in position 126 and determine that a fan control model indicates 10 watts to be removed from position 126 corresponds with operating fan 106 at 40%, fan 108 at 80% and fan 110 at 80%. The fan controller may generate control signals commanding fan 106 to operate at 40%, fan 108 to operate at 80%, and fan 110 to operate at 80% in accordance with the fan control model. In some embodiments the fan control model may include shared fan angles in control signal values. For example, a fan controller may determine based on indicated thermal conditions in an electronic device in position 126 that 10 watts of thermal energy are to be removed from the electronic device in position 126 and determine that a fan control model indicates 10 watts to be removed from position 126 corresponds with operating fan 106 at 40% at an angle of −30° from vertical and +30° from horizontal, fan 108 at 80% at an angle of −10° from vertical and +30° from horizontal, and fan 110 at 80% at an angle of +30° from vertical and +30° from horizontal. The fan controller may generate control signals commanding fan 106 to operate at 40% at an angle of −30° from vertical and +30° from horizontal, fan 108 to operate at 80% at an angle of −10° from vertical and +30° from horizontal, and fan 110 to operate at 80% at an angle of +30° from vertical and +30° from horizontal in accordance with the fan control model.

In some embodiments, a fan controller may use various methods to select a position in a rack to be used for selecting control signal values based on a fan control model. For example, a fan controller may select a position in a rack to be used for selecting control signal values based on the position indicating the highest temperature, indicating the most amount of thermal energy to be removed, or other methods. In some embodiments, particular positions may be used for selecting control signal values based on a fan control model and representative thermal conditions for the particular positions may be generated based on thermal conditions indicated in surrounding positions (e.g. a composite thermal condition in a representative position may be generated). In some embodiments various other methods may be used to select a closely matching set of control signal values based on indicated thermal conditions in different positions in a rack and a fan control model.

In some embodiments, different positions in a rack may be organized into zones and a fan controller may control one or more of the zones separately from one or more other ones of the zones. For example, a fan controller may select a set of control signal values based on a fan control model for a top zone of a rack that includes positions in the top half of the rack and may separately select a set of control signal values based on a fan control model for a bottom zone of the rack that includes positions in the bottom half of the rack. In some embodiments, a rack may be organized into various combinations of zones.

In some embodiments, a fan control model may be organized in yet other ways. For example, a fan control model may be organized as one or more sets of rules. For example, a rule may indicate that when certain thermal conditions are indicated in certain positions in a rack, a particular fan should operate according to a particular control signal value and surrounding shared fans should operate at control signal values that are proportional to the particular control signal value. The rules may also indicate that if a certain condition is met, then a different fan becomes a dominant fan for control and different surrounding shared fans should operate at control signal values that are proportional to the new dominant fan. Note these examples of rules are given as examples, many other rules that describe relationships between control signal values and performance values may be included in a fan control model. In some embodiments, machine learning techniques may be used to generate rules included in a fan control model and may be used to update rules included in the fan control model over time to improve the rules included in the fan control model. Some machine learning techniques that may be used include decision tree learning, association rule learning, artificial neural networks, inductive logic programming, support vector machines, clustering, reinforcement learning, representation learning, similarity and metric learning, sparse dictionary learning, genetic algorithms, and the like.

Several examples of fan control models have been given. However it should be understood that other types of fan control models that describe relationships for controlling a plurality of shared fans coupled to a rack may be used in some embodiments by a fan controller to generate a plurality of control signals for controlling a plurality of shared fans.

A rack cooling system, such a rack cooling system 100, may cool electronic devices mounted in a rack experiencing different thermal conditions in different positions in the rack while reducing surplus airflow to the electronic devices mounted in the rack. For example, a fan controller, such as fan controller 112 may be configured to generate a plurality of control signals for controlling a plurality of shared fans, such as shared fans 106, 108, and 110 based on thermal conditions in electronic devices, such as electronic devices 104, positions in the rack associated with the electronic devices and a fan control model. In FIG. 1A, electronic devices 104 may be operating under normal thermal conditions and fan controller 112 may generate control signals that command shared fan 106 to operate at 50% of its range, shared fan 108 to operate at 50% of its range, and shared fan 110 to operate at 50% of its range.

A change in operating load on one or more of the electronic devices may cause the thermal conditions in one or more of the electronic devices to change. The changed thermal conditions may be indicated in condition signals received from the electronic devices mounted in the rack. The condition signals may indicate that a particular electronic device in a particular position in a rack is hotter than other electronic devices in other positions in the rack. For example, electronic device 128 in position 118 may be hotter than other ones of electronic devices 104 in rack 102. Fan controller 112 may generate control signal values based on these pieces of information and based on a fan control model. The control signal values may command shared fan 106 to operate at 30% of its range, shared fan 108 to operate at 80% of its range, and shared fan 110 to operate at 60% of its range. In response to the control signals, shared fans 106, 108, and 110 may induce a plurality of different respective airflows through electronic devices 104 to remove thermal energy from electronic devices 104 in accordance with the control signals (e.g. shared fan 106—30%, shared fan 108—80%, and shared fan 110—60%).

Inducing a plurality of different respective air flows through the plurality of electronic devices mounted in a rack based on thermal conditions in the electronic devices, the positions in the rack associated with the electronic devices, and a fan control model for shared fans coupled to a rack may result in more efficient cooling of electronic devices mounted in a rack than cooling systems that do not include separate control for separate ones of shared rack-level fans. For example, in FIG. 1A, electronic devices 104 are operating in normal conditions where electronic devices 104 are generating similar amounts of waste energy. In FIG. 1A shared fans 106, 108, and 110 are each operating at 50% of their operating range. Continuing the example, in FIG. 1B, electronic device 128 in position 118 is experiencing a significant increase in processing demand and generates a significantly high amount of waste energy. In response, fan controller 112 commands fan 108 to increase from 50% of its operating range to 80% of its operating range and commands fan 110 to increase from 50% of its operating range to 60% of its operating range. Fan controller 112 also commands shared fan 106 to reduce from 50% of its operating range to 30% of its operating range. Because shared fan 108 is operating at 80% of its operating range, some of the output from shared fan 108 may combine with the output of shared fan 106, such that shared fan 106 does not need to induce as much air flow to remove a similar amount of waste energy from electronic devices 104. Also, shared fan 110 and shared fan 108 increasing their respective outputs causes an air flow induced by shared fan 110 and shared fan 108 to overlap in combined airflow 124. Thus the airflow through electronic device 128 is increased. Note that in a control scheme that operates shared fans 106, 108, and 110 to control without regard to thermal conditions in particular positions in a rack, the fan controller would have adjusted all three of shared fans 106, 108, and 110 to operate at 80% of their output. Also, note that some fan controllers may operate in an "on"-"off" control scheme such that shared fans 106, 108, and 110 would operate at 100% of their output under similar circumstances. However, a rack control system with a fan controller such as fan controller 112 and shared fans 106, 108, and 110 as described above results in less surplus air flow, less power consumption, and more efficient operation than cooling systems that operate shared fans without regard to thermal conditions in particular positions in a rack or a cooling system that operate in an "on"-"off" control scheme. Note that when compared to a system that controls shared fans at the same speed (e.g. 80%), a rack cooling system as described above results in savings such as: shared fan 106—30% output vs. 80% output or savings of 50%, shared fan 108—80% output vs 80% output or equivalent cost, and shared fan 110—60% output vs. 80% output or savings of 20%.

In FIG. 1C electronic device 128 in position 118 is at a similar temperature to electronic devices 104 due to the additional waste heat being removed from electronic device 128 in position 118 by combined airflow 124.

In some embodiments, a fan control model may include combinations of control signal values that command shared fans, such as shared fans 106, 108, and 110 to increase airflows through discrete electronic devices in particular positions in a rack, such as electronic device 128 in position 118.

In some embodiments, a rack, such as rack 102, may include various numbers of electronic devices. Ellipses are shown in FIGS. 1A-1C to indicate that rack 102 may include more or less electronic devices than are illustrated in FIGS. 1A-1C. In some embodiments more or less shared fans may be coupled to a rack, than are illustrated in FIGS. 1A-1C. Also, FIGS. 1A-1C have been described in terms of three fans coupled to a rack in three vertical positions for sake of clarity. However, in some embodiments an array of fans may include multiple fans coupled to a rack in both horizontal directions (rows) and vertical directions (columns).

As discussed in more detail below, in some embodiments a fan control model or a portion of a fan control model may be generated as part of an initialization operation, may be obtained from a source outside of electronic devices mounted in a rack, or may be shared with sources outside of electronic devices mounted in a rack. In some embodiments, a configuration of electronic devices mounted in a rack may be changed, and a fan controller may initiate an update of a fan control model in response to the change in configuration. For example, an electronic device in a particular position in a rack, such as electronic device 128 in position 118, may be exchanged for an electronic device with a different configuration, for example different processors, different memory, different air flow characteristics, etc. The change in configuration of the electronic device in the particular position may alter air flow characteristics and cooling characteristics of the electronic device in the particular position and in other surrounding electronic devices in other positions. The changes in air flow characteristics and cooling characteristics may make it such that a currently used fan control model is inaccurate for the new configuration of electronic devices mounted in the rack. In some embodiments, a fan control model may be updated for the new configuration. In some embodiments, a fan controller may be configured to share an updated fan control model with other fan controllers that control cooling of electronic devices mounted in other racks that are undergoing similar configuration changes.

In some embodiments, a fan controller, such as fan controller 112 may be implemented on separate hardware such as a PLC separate from electronic devices 104. In some embodiments, a fan controller may be remotely implemented, such as being implemented by a building management system that coordinates operations related to multiple racks of electronic devices in a data center. In some embodiments, a fan controller may be implemented in other ways.

FIG. 2 illustrates a top view of a rack, a plurality of electronic devices mounted in the rack and a plurality of shared fans coupled to the rack, according to some embodiments. Rack cooling system 200 may be the same as rack cooling system 100 described in regard to FIGS. 1A-1C and shared fan 206 may be a top view of shared fan 106 in FIGS. 1A-1C.

In some embodiments, a rack may include more than one electronic device mounted in a slot of the rack. For example, rack 202, includes electronic devices 232 and 234 that are half-width servers mounted in the same slot of rack 202. In a similar manner as described in regard to FIGS. 1A-1C, a fan controller, such as fan controller 112, may be configured to determine a horizontal position of an electronic device mounted in a rack. For example, fan controller 112 may determine the horizontal positions associated with electronic devices 232 and 234. Also in a similar manner as described in regard to FIGS. 1A-1C, a fan controller, such as fan controller 112, may generate control signals that command a plurality of shared fans to induce a plurality of different respective air flows through electronic devices mounted in a rack to remove thermal energy from the electronic devices mounted in the rack. For example, fan controller 112 may command shared fan 206 to operate at 50% of its operating range and command shared fan 226 to operate at 75% of its operating range in response to different thermal conditions in electronic devices 232 and 234. This may result in combined air flow 230 that directs more air flow to electronic device 232 than electronic device 234. In some embodiments, a fan control model may include information regarding both vertical and horizontal positions in a rack, and a rack cooling system, such as rack cooling systems 100 and 200, may control in a similar manner as described above in regards to FIGS. 1A-1C based on the fan control model that includes both vertical and horizontal position information.

Figure 3:
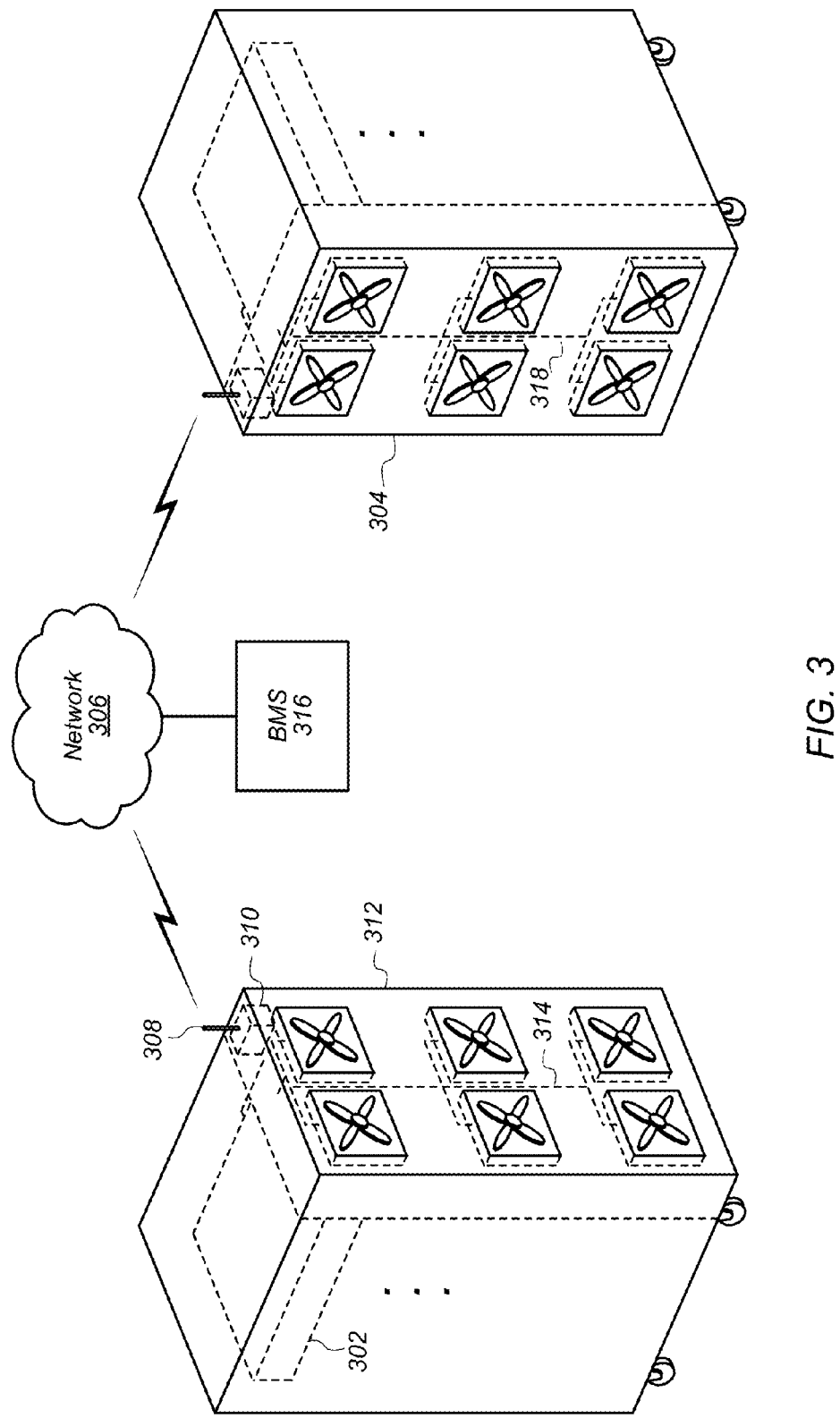
FIG. 3 illustrates multiple racks wherein electronic devices in the racks are connected to each other and a building management system via a network, according to some embodiments.

FIG. 3 illustrates multiple racks wherein electronic devices in the racks are connected to each other and a building management system via a network, according to some embodiments. In some embodiments, a fan controller, such as fan controller 112 described in regards to FIGS. 1A-1C, may be implemented on an electronic device, such as server 302, that is connected to one or more other electronic devices via a network. A fan controller connected to other electronic devices may receive and/or send a portion or all of a fan control model to/from other electronic devices. For example, a fan controller implemented on server 302 in rack 312 may receive a fan control model from electronic devices mounted in rack 304. A top of rack switch, such as top of rack switch 310, may have a connection, such as a connection 308, to a network, such as network 306, and allow a fan controller implemented on server 302 to communicate with devices outside of rack 312. A fan speed controller, such as a fan speed controller implemented on server 302, may then use the received fan control model when generating control signals, such as control signals 314 for controlling shared fans. Also as discussed above, a fan controller may update a fan control model and share the updated fan control model with electronic devices outside of a rack associated with the fan speed controller. For example a fan speed controller implemented on server 302 may share a portion or all of a fan control model with electronic devices in rack 304 or with a building management system, such as BMS 316. In some embodiments, a fan speed controller may be implemented on a building management system and send control signals to shared fans coupled to a rack. For example, a fan controller, such as fan controller 112 described in regard to FIGS. 1A-1C, may be implemented on BMS 316 and remotely control fans coupled to racks 312 and 304 via control signals 314 and 318.

In some embodiments, a fan control model may be generated based on experienced performances of a plurality of shared fans for controlling a plurality of electronic devices mounted in a rack and may be shared with a fan controller used to control cooling of a rack comprising electronic devices mounted in the rack in a similar configuration. For example, a fan control model may be generated for a configuration of electronic devices in rack 312 and shared with rack 304. In some embodiments, a configuration of electronic devices in a rack may be changed, an updated fan control model may be generated or updated for the updated configuration and may be shared with another rack undergoing a similar change in configuration of electronic devices mounted in the rack. For example, one or more servers in rack 312 may be changed out to different server configurations with different heat loads or airflow characteristics. In response, a fan control model used to cool electronic devices mounted in rack 312 may be updated. Electronic devices mounted in another rack, such as rack 304, may be undergoing similar configuration changes, and the updated fan control model may be shared between racks 312 and 304. In some embodiments a building management system, such as BMS 316, may distribute updated fan control models in response to changes in configurations of electronic devices mounted in racks, such as due to changes in electronic devices mounted in racks 312 and 304.

Racks 312 and 304 illustrated in FIG. 3 may include rack cooling systems 100 and 200 as described in regard to FIGS. 1-2.

Figure 4:
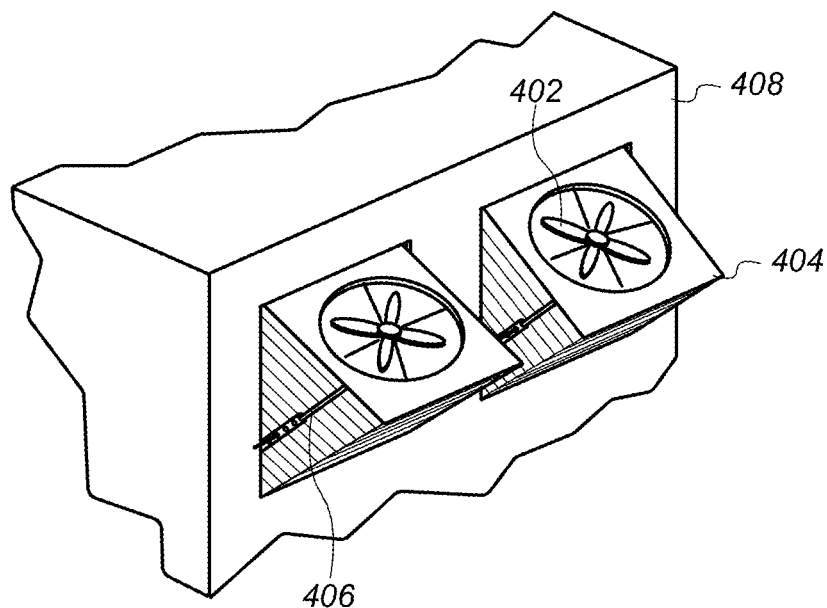
FIG. 4 illustrates adjustable shared fans coupled to a rack, according to some embodiments.
Figure 5:
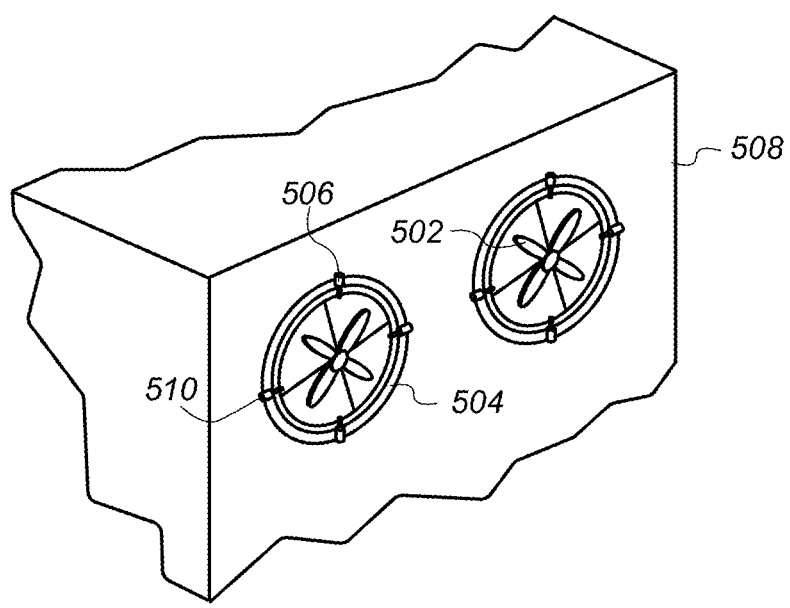
FIG. 5 illustrates adjustable shared fans coupled to a rack, according to some embodiments.

In some embodiments, a shared fan may be mounted in a housing with an adjustable angle. For example in FIG. 4, shared fans 402 are mounted in housings 404. Any of the shared fans described in regard to FIGS. 1-9 may be mounted in housings with adjustable angles. In some embodiments, an angle of a shared fan may be manually adjustable. For example adjustment mechanism 406 may permit an angle between rack 408 and shared fans 402 in housings 404 to be adjusted. In some embodiments, a shared fan may be mounted in a housing may be automatically adjusted by a fan controller or some other control system. For example, in FIG. 5, shared fans 502 are mounted in housings 504 that include automated adjustment mechanisms 506 and 510. Any of the shared fans described in regards to FIGS. 1-9 may be mounted in housing that include automated adjustment mechanisms. A fan controller, such as fan controller 112 described in FIGS. 1A-1C may further generate control signals commanding adjustment of one or more angles between a shared fan, such as shared fans 502, and a rack, such as rack 508, based on thermal conditions in different electronic devices in different positions in a rack and a fan control model. Changing an angle of a particular shared fan may allow an airflow induced by the particular shared fan to be directed at particular electronic devices, groups of electronic devices, or zones of a rack, based on indicated thermal conditions. In some embodiments, a fan control model may include fan angle information in addition to fan speed information.

In some embodiments, louvers may be used to direct air flow induced by one or more shared faces. For example, louvers may be mounted on a back-side of fans 502 and 504 inside rack 508. In some embodiments, louvers may be used instead of adjusting fan angles to direct an airflow induced by shared fans or in some embodiments, louvers may be used in conjunction with fans mounted in a housing with adjustable angles to direct an airflow induced by shared fans. In some embodiments, control signal generated by a fan controller may command louvers mounted with a particular shared fan to adjust to a particular angle to direct an air flow induced by the particular fan in a particular direction.

Figure 6:
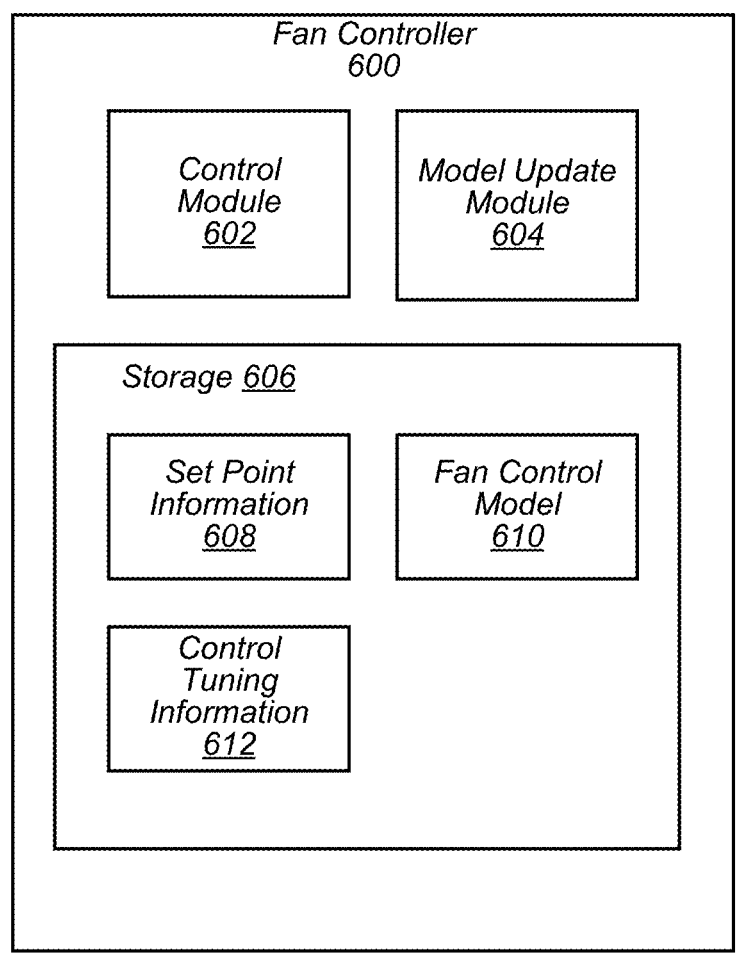
FIG. 6 illustrates a fan controller, according to some embodiments.

FIG. 6 illustrates a fan controller, according to some embodiments. A fan controller may include a control module, a storage, and a model update module. A storage of a fan controller may store set point information, control tuning information, and a fan control model. For example fan controller 600 includes control module 602, model update module 604, and storage 606 that includes set point information 608, fan control model 610 and control tuning information 612. In some embodiments a fan control module may access information stored in a storage such as storage 606 to determine a control value for a control signal to be generated by a fan controller, such as fan controller 600. For example, control module 602 may access set point information 608, control tuning information 612 and fan control model 610. Fan control model 610 may be similar to the fan control models described in regards to FIGS. 1A-1C. Set point information 608 may include information regarding set points for cooling a plurality of electronic devices mounted in a rack. For example set point information 608 may include temperatures that are not to be exceeded in electronic devices mounted in a rack. In some embodiments, separate electronic devices mounted in separate positions in a rack may be controlled to different set points.

Control tuning information 612 may include information such as proportional gain constants, derivate gain constants, and error gain constants. Control tuning information may also include information that instructs how a control module responds to changes in thermal conditions in electronic devices mounted in a rack. For example, control tuning information may instruct a control module on how fast or slow to change fan speeds in response to a change in thermal conditions in one or more electronic devices mounted in a rack. In another example, control tuning information may instruct a control module on how fast or slow to change a fan angle in response to a change in thermal conditions in one or more electronic devices mounted in a rack or how fast or slow to adjust a louver position. In some embodiments, set point information 608 and control tuning information 612 may be included in a fan control model, such as fan control model 610. In some embodiments, a model update module, such as model update module 604 may be configured to perform an initialization operation to generate a fan control model or a portion thereof, or to perform an update operation to update a fan control model.

In some embodiments, a fan controller such as fan controller 600 may be implemented in software that operates on a server in a rack. In some embodiments, a fan speed controller, such as fan speed controller 600, may be implemented in hardware, such as a PLC. In some embodiments, a control module, such as control module 602, may be implemented on a PLC, and may access a storage, such as storage 606 on a server, wherein the storage includes set point information, control tuning information and/or a fan control model, such as set point information 608, control tuning information 612, and/or fan control model 610.

Figure 7:
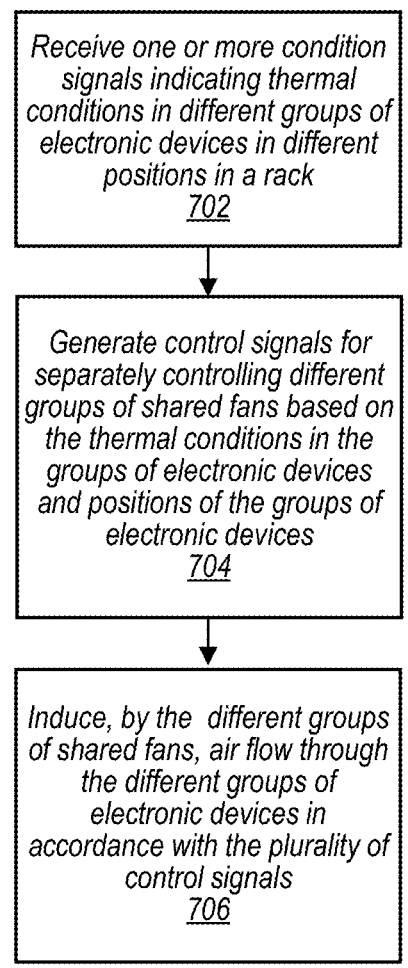
FIG. 7 illustrates controlling a plurality of shared fans, according to some embodiments.

FIG. 7 illustrates controlling a plurality of shared fans, according to some embodiments. At 702 one or more condition signals indicating thermal conditions in two or more different groups of electronic devices in a rack are received. The two or more different groups of electronic devices may comprise one or more electronic devices and each group of the two or more groups of electronic devices may be associated with a respective location in a rack. In some embodiments, a virtual sensor may generate the plurality of condition signals indicating thermal conditions in the two or more different groups of electronic devices mounted in the rack.

At 704, a plurality of control signal for controlling a plurality of shared fans arranged in an array and coupled to the rack are generated. Each group of the two or more groups of one or more shared fans may be associated with a respective location in the array of shared fans. The shared fans may be configured to provide cooling to multiple ones of the electronic devices mounted in the rack. The plurality of control signals may be generated based on respective thermal conditions in the two or more respective different groups of one or more electronic devices and respective positions in the rack associated with the two or more respective different groups of one or more electronic devices. In some embodiments, the plurality of control signals for controlling the plurality of shared fans arranged in the array may be further based on a fan control model. The fan control model may be used to determine combinations of control signal value to control the two or more groups of one or more fans in respective locations in the array based on combinations of thermal conditions in the electronic devices and respective positions of the electronic devices in the rack.

At 706, air flows are induced through the two or more groups of one or more electronic devices by the two or more groups of one or more shared fans in accordance with the generated control signals.

In some embodiments, the plurality of control signals may be generated further based on additional information such as set-point information, control tuning information, or other parameters used for control.

Figure 8:
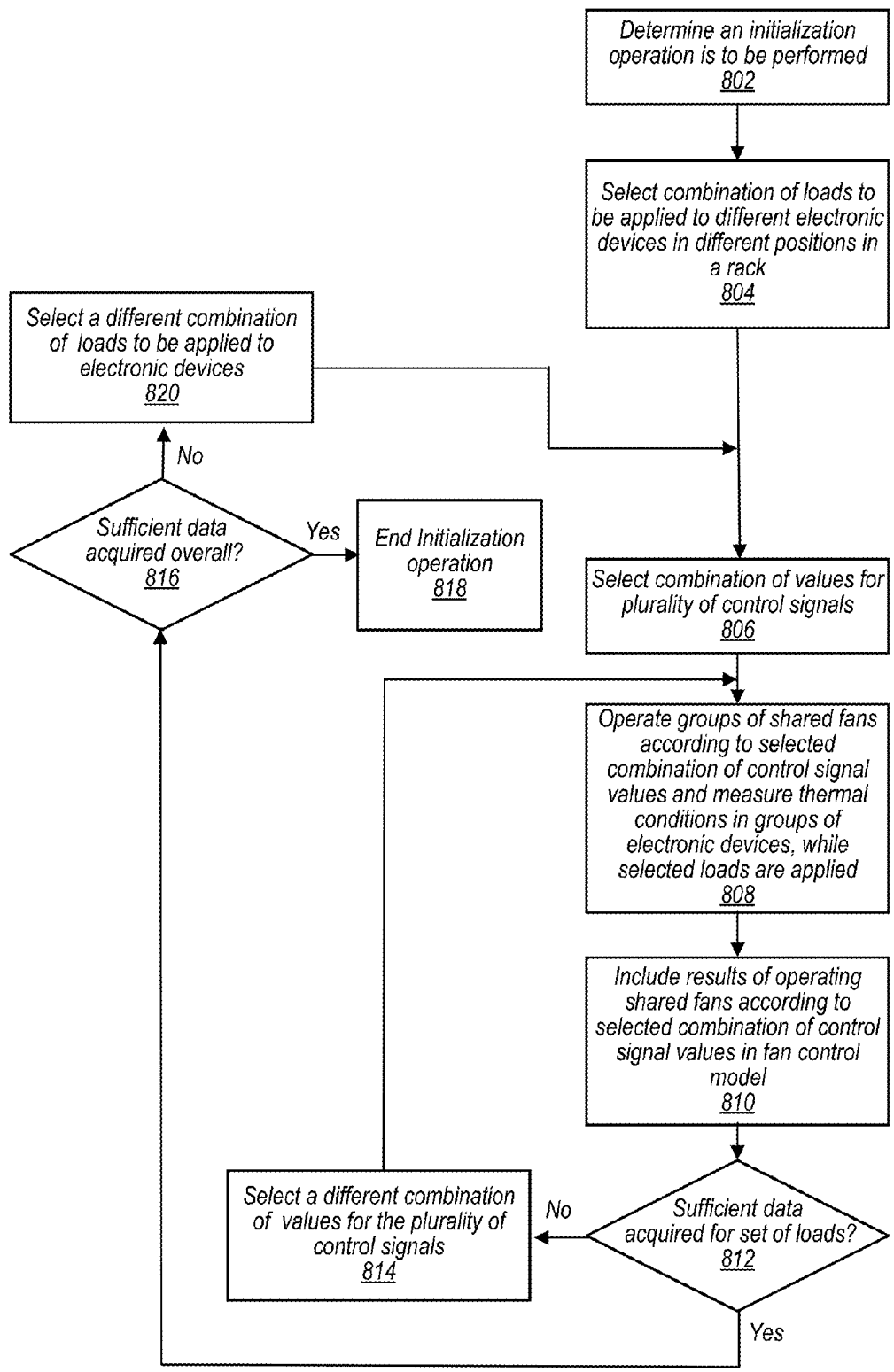
FIG. 8 illustrates initializing a fan controller, according to some embodiments.

FIG. 8 illustrates initializing a fan controller, according to some embodiments. At 802 it is determined that an initialization operation is to be performed. A determination to perform an initialization operation may be based on a received command or may be automatically initiated by a fan controller based on a condition being met. For example, when a rack is first put in service, a command may be sent to a fan controller instructing a model update module to perform an initialization operation. In another example, a fan controller may determine that configurations in a rack have changed since the last time an initialization operation was performed and automatically determine that an initialization operation is to be performed.

At 804 a combination of loads to be applied to the electronic devices mounted in the rack is selected. For example, a combination of loads may be to operate different electronic devices in different positions in the rack under high loads while other ones of the electronic devices in other positions in the rack are operated at medium loads or low loads.

At 806 a combination of control signal values are selected for controlling a plurality of shared fans coupled to the rack. The plurality of shared fans may comprise two or more different groups of one or more shared fans, wherein each group of the two or more different groups of one or more shared fans is associated with a different respective location in the array. The combination of control signal values selected for controlling the plurality of shared fans coupled to the rack may command the shared fans in the two or more different groups associated with the different locations in the array to operate at different speeds.

At 808, the two or more groups of shared fans are operated in accordance with the selected plurality of control signal values and the selected combination of loads to be applied to the different electronic devices in the different positions in the rack. While the plurality of shared fans are operated in accordance with the plurality of control signal values and the electronic devices are operated in accordance with the combination of loads, thermal conditions in two or more groups of electronic devices may be measured. The two or more groups of electronic devices may be associated with different positions in the rack. The measurements while the fans are in operation may indicate performance of the shared fans while operating according to the selected combination of control signal values for removing thermal energy from respective electronic devices located in different respective positions in a rack when the electronic devices mounted in the rack are operated in accordance with the selected combination of loads.

At 810, the results of operating the two or more groups of one or more shared fans according to the selected combination of control signal values and selected combination of loads are used to update a fan control model. The results may include capacities of the fans when operated in the particular selected combination of control signal values to remove thermal energy from different respective electronic devices mounted in different respective positions in a rack. The control signal values may include a fan speed and a fan orientation (e.g. an angle from vertical and/or an angle from horizontal). In some embodiments, different relationships may be derived from the results of operating the two or more groups of one or more shared fans according to the selected combination of control signal values and the selected combination of loads applied to the electronic devices mounted in the rack. The different derived relationships may then be included in a fan control model.

At 812, it is determined in a sufficient amount of data has been acquired for the selected combination of loads to be applied to the electronic devices mounted in the rack. In some embodiments, an initialization operation may run through a set number of combinations of control signal values, such that when the set number of combinations has been tested the fan controller determines that sufficient data has been acquired for the selected combination of loads to be applied to the electronic devices. In some embodiments various machine learning techniques, such as neural networks, may be used to determine when sufficient data has been acquired for a combination of loads.

In response to determining a sufficient amount of data has not been acquired at 814, a different combination of values for the plurality of control signal values is selected and the process returns to 808. During an initialization operation multiple different combinations of values for the plurality of control signals may be tested and resulting performance values measured and recorded for the multiple different combinations of control signal values. At 816, it is determined if sufficient data has been acquired for the overall initialization operation or if another combination of loads to be applied to the electronic devices in different positions in the rack is to be selected. In a similar manner as determining if enough combinations of values for the plurality of control signals have been tested, a model update module may determine whether enough combinations of loads have been tested. In some embodiments, a initialization operation may test a set number of combinations of loads and when the set number have been tested, the model update module may determine that sufficient data has been acquired. In some embodiments, various machine learning techniques may be used to determine if enough data has been acquired. In response to determining sufficient data has been acquired for the overall initialization operation, at 818 the initialization operation ends. In response to determining additional combinations of loads are to be tested, at 820 a different combinations of loads are selected and the initialization operation reverts back to 806.

Figure 9:
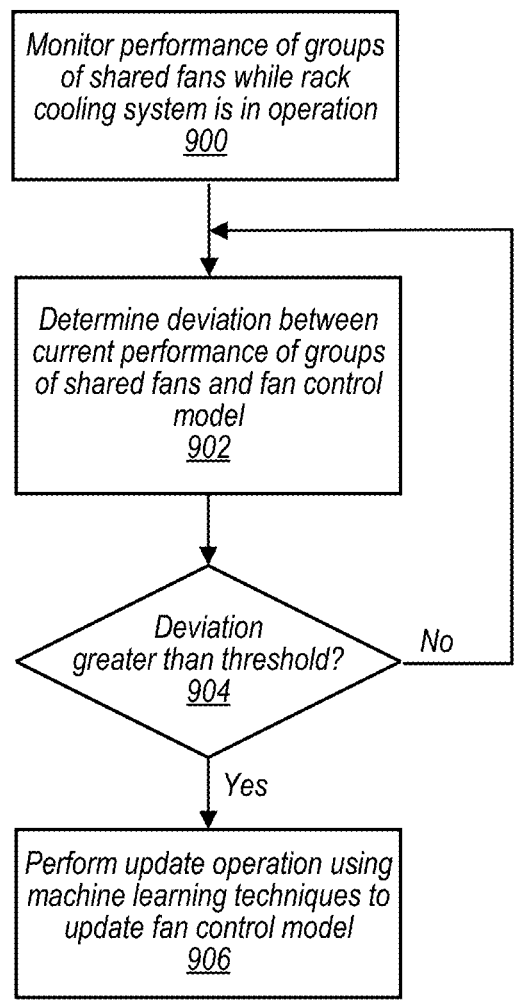
FIG. 9 illustrates updating a fan control model, according to some embodiments.

FIG. 9 illustrates updating a fan control model, according to some embodiments. At 900 performance of groups of one or more shared fans are monitored while the one or more shared fans are in operation cooling electronic devices mounted in a rack. At 902, one or more deviations between current performances of two or more groups of one or more shared fans in different respective locations in an array of fans coupled to a rack when operating according to a certain combination of control signal values is determined in comparison to performance values included in a fan control model for the two or more groups of one or more shared fans when operated according to the same certain combination of control signal values. For example, the actual performance of the shared fans at removing thermal energy from electronic devices may deviate from an expected performance of the shared fans at removing thermal energy that is predicted by a fan control model. In some embodiments a control response may be delayed or a control variable such as a fan speed may reach a maximum, such as 100% output, without controlling a thermal condition in one of the electronic devices to set point. The failure of the controller to control to set point may be determined a deviation between current performance and predicted performance predicted by a fan control model and cause an update operation to be performed.

At 904, if the deviation is greater than a threshold amount, then at 906 an update operation is performed to update the fan control model. The update operation may be performed using various machine learning techniques as described in regard to FIGS. 1A-1C. If the deviation is less than the threshold, the process reverts to 902 and the operation of the plurality of shared fans is continued to be monitored for deviations in performance in comparison to a fan control model.

Figure 10:
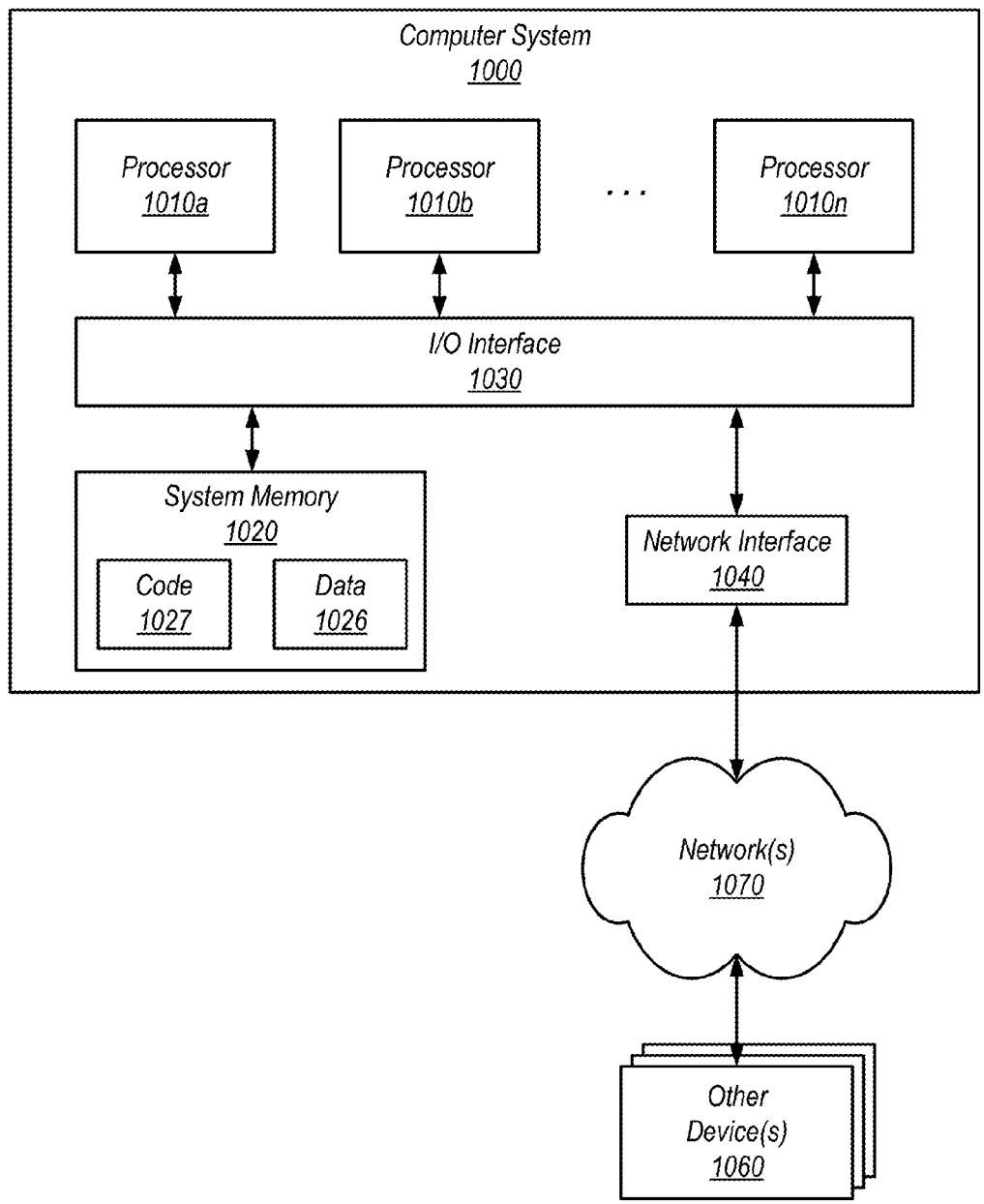
FIG. 10 illustrates a block diagram of an example computer system that may be used in some embodiments.

FIG. 10 is a block diagram illustrating an example computer system that may be used in some embodiments.

In some embodiments, a system that implements a portion or all of one or more of the technologies, including but not limited to a portion or all of the computing systems, devices, fan controllers, building management systems, fan control modules, or one or more modules included in the controllers described herein, may include a general-purpose computer system that includes or is configured to access one or more computer system-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the fan controllers, one or more modules included in the fan controllers, and various sensors, systems, devices, and apparatuses as described herein, are shown stored within system memory 1020 as code 1027 and data 1026.

In some embodiments, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1070, such as other computer systems or devices, management systems, control modules, etc., as illustrated in FIGS. 1 through 9. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be a computer system-accessible medium configured to store program instructions and data for implementing embodiments of controllers as described above relative to FIGS. 1-9, e.g., the control module 602, the model update module 604, the set point information 608, the control tuning information 612, or the fan control model 610. In other embodiments, program instructions and/or data may be received, sent or stored upon different types of computer-accessible media. Generally speaking, a computer system-accessible medium may include non-transitory storage media or memory media such as magnetic or optical media, e.g., disk or DVD/CD coupled to computer system 1000 via I/O interface 1030. A non-transitory computer system-accessible storage medium may also include any volatile or non-volatile media such as RAM (e.g. SDRAM, DDR SDRAM, RDRAM, SRAM, etc.), ROM, etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link such as may be implemented via network interface 1040.

Various embodiments may further include receiving, sending or storing instructions and/or data implemented in accordance with the foregoing description upon a computer-accessible medium. Generally speaking, a computer system-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
    a plurality of electronic devices mounted in a rack;
    a plurality of shared fans arranged in an array and coupled to the rack; and
    a fan controller configured to:
        receive one or more condition signals indicating respective thermal conditions in different respective groups of one or more electronic devices of the plurality of electronic devices, wherein each group of the different groups of one or more electronic devices is associated with a respective position in the rack;
        access a fan speed control model generated based on performance relationships due to interactions between the plurality of shared fans of the array; and
        generate a plurality of respective control signals for controlling different respective groups of one or more shared fans of the plurality of shared fans, wherein the fan controller is configured to generate the plurality of control signals based on:
            the respective thermal conditions in the different groups of one or more electronic devices,
            respective positions in the rack for the different groups of one or more electronics devices, and
            the fan speed control model;
        wherein the fan controller is configured to generate the plurality of respective control signals to operate at least one of the groups of one or more shared fans at a different fan speed than another one of the groups of one or more shared fans, wherein the different fan speeds are greater than zero
        wherein the fan speed control model is configured to be updated in response to one or more deviations being determined between respective performances of two or more of the groups of shared fans that are located in different respective positions in the array when being operated in accordance with a combination of the respective control signals in comparison to respective performance values included in the fan speed control model for the two or more groups of shared fans located in the different respective positions in the array.

2. The apparatus of claim 1, wherein, subsequent to generating the plurality of respective control signals, the fan controller is further configured to:
    receive one or more additional condition signals indicating subsequent thermal conditions in the different groups of one or more electronic devices; and
    change one or more of the plurality of respective control signals based at least in part on:
        a current state of the plurality of respective control signals,
        the subsequent respective thermal conditions and corresponding respective positions of the different groups of one or more electronic devices, and
        the fan speed control model.

3. The apparatus of claim 1, wherein the fan speed control model comprises relationships between control signal values for controlling the plurality of shared fans and corresponding performance values for the plurality of shared fans, wherein the performance values correspond to capacities of the plurality of shared fans to remove thermal energy from particular electronic devices of the plurality of electronic devices mounted in particular positions in the rack when the plurality of shared fans are operated in accordance with the control signal values.

4. The apparatus of claim 1, wherein the fan controller is implemented on one or more of the electronic devices mounted in the rack.

5. The apparatus of claim 1, further comprising one or more virtual sensors, wherein the one or more condition signals are received from the one or more virtual sensors, wherein the one or more virtual sensors are configured to generate the one or more condition signals indicating the thermal conditions in the different groups of one or more electronic devices based, at least in part, on one or more relationships between one or more non-thermal measurements related to the electronic devices in the different groups of one or more electronic devices and the thermal conditions.

6. The apparatus of claim 1, wherein one or more of the plurality of shared fans are mounted in respective housings, wherein individual ones of the respective housings are configured to couple to the rack, wherein respective angles between the individual ones of the respective housings and the rack are adjustable such that air flows induced by the shared fans mounted in the respective housings are directed according to the respective angles;
    wherein the fan speed control model further comprises one or more relationships between respective angles between the individual ones of the respective housings and the rack for the shared fans in the respective locations in the array and the respective positions in the rack associated with the two or more different respective groups of one or more electronic devices.

7. A method, comprising:
receiving one or more condition signals relating to thermal conditions in different groups of one or more electronic devices mounted in a rack, wherein each respective group of the different groups of one or more electronic devices is associated with a respective position in the rack; and
generating a plurality of control signals for controlling a plurality of shared fans arranged in an array and coupled to the rack, wherein the plurality of shared fans comprises different groups of one or more shared fans each associated with a respective location in the array, wherein each respective group of the different groups of one or more shared fans are configured to provide cooling to more than one respective group of the different groups of one or more electronic devices, wherein the plurality of control signals are generated based on:
respective thermal conditions in respective different groups of one or more electronic devices of the different groups of the one or more electronic devices;
respective positions in the rack associated with the respective different groups of one or more electronics devices; and
a fan speed control model generated based on performance relationships due to interactions between the plurality of shared fans arranged in the array; and
wherein the plurality of control signals cause at least one of the different groups of one or more shared fans to induce a different amount or direction of airflow than another one of the different groups of one or more shared fans, wherein the at least one of the different groups of one or more shared fans and the other one of the different groups of one or more shared fans both induce at least some airflow
wherein the fan speed control model is updated in response to determining one or more deviations between current performances of two or more of the groups of shared fans in different respective locations in the array when operating according to a combination of the control signals in comparison to performance values included in the fan speed control model for the two or more groups of shared fans in the different respective locations in the array.

8. The method of claim 7, wherein the fan control model includes relationships between control signal values for controlling the plurality of shared fans and corresponding performance values for the plurality of shared fans, wherein the performance values correspond to capacities of the plurality of shared fans to remove thermal energy from particular electronic devices of the plurality of electronic devices mounted in particular positions in the rack when the plurality of shared fans are operated in accordance with the control signal values.

9. The method of claim 8, wherein the method further comprises:
performing an initialization operation to generate at least a portion of the fan control model, wherein performing said initialization operation comprises:
selecting a combination of control signal values for operating the plurality of shared fans;
operating the plurality of shared fans according to the selected combination of control signal values and measuring thermal conditions in the different groups of one or more electronic devices mounted in the rack while operating the plurality of shared fans according to the selected combination of control signal values;
updating the fan control model, based at least in part, on the measured thermal conditions in the different groups of one or more electronic devices and the combination of control signal values used for operating the plurality of shared fans when the measured thermal conditions where measured; and
selecting a different combination of control signal values and repeating said operating and said updating.

10. The method of claim 8, wherein the method further comprises:
determining one or more deviations between a current performance of the plurality of shared fans for removing thermal energy from the plurality of electronic devices and one or more of the performance values included in the fan control model; and
in response to determining the one or more deviations, updating the fan control model using an iterative machine learning technique based upon applying a combination of control signals while performing said receiving and said generating.

11. The method of claim 8, further comprising:
receiving at least a portion of the fan control model from a source outside the rack;
wherein the at least a portion of the fan control model received from the source outside the rack is generated based on performance relationships between another plurality of shared fans in relation to removing thermal energy from another plurality of electronic devices mounted in another rack.

12. The method of claim 7, wherein said receiving and said generating are performed by one or more remote computing devices not mounted in the rack.

13. The method of claim 7, further comprising:
adjusting an angle of one or more shared fans of the plurality of shared fans coupled to the rack in accordance with the plurality of control signals for controlling the plurality of shared fans, wherein adjusting the angle of the one or more shared fans directs respective air flows induced by the one or more shared fans;
wherein said generating the plurality of control signals for controlling the plurality of shared fans includes generating control signals for adjusting the angle of the one or more shared fans.

14. The method of claim 7, wherein, more than one electronic device is mounted in a given horizontal slot of a plurality of horizontal slots in the rack, and wherein one or more groups of the different groups of one or more electronic devices is associated with a respective horizontal position in the rack.

15. A non-transitory computer-readable storage medium storing program instructions that, when executed on one or more computing devices, cause the one or more computing devices to:
receive one or more condition signals relating to thermal conditions in different groups of one or more electronic devices mounted in a rack, wherein each respective group of the different groups of one or more electronic devices is associated with a respective position in the rack; and
generate a plurality of control signals for controlling a plurality of shared fans arranged in an arrangement and coupled to the rack, wherein the plurality of shared fans comprises different groups of one or more shared fans each associated with a respective location in the arrangement, wherein each respective group of the different groups of one or more shared fans is configured to provide cooling to more than one respective group of the different groups of one or more electronic devices, wherein the plurality of control signals are generated based, at least in part, on:

respective thermal conditions in respective different groups of one or more electronic devices of the different groups of one or more electronic devices;

respective positions in the rack associated with the respective different groups of one or more electronics devices; and a fan speed control model generated based on performance relationships due to interactions between the plurality of shared fans; and wherein the plurality of control signals are generated to operate at least one of the different groups of one or more shared fans to induce a different amount or direction of airflow than another one of the different groups of one or more shared fans, wherein the at least one of the different groups of one or more shared fans and the other one of the different groups of one or more shared fans both induce at least some airflow wherein the fan speed control model is updated in response to determining one or more deviations between current performances of two or more of the groups of shared fans in different respective locations in the array when operating according to a combination of the control signals in comparison to performance values included in the fan speed control model for the two or more groups of shared fans in the different respective locations in the array.

16. The non-transitory computer-readable storage medium of claim 15, wherein the fan control model describes relationships between control signal values for controlling the plurality of shared fans and corresponding performance values for the plurality of shared fans, wherein the performance values correspond to capacities of the plurality of shared fans to remove thermal energy from particular electronic devices of the plurality of electronic devices mounted in particular positions in the rack when the plurality of shared fans are operated in accordance with the control signal values.

17. The non-transitory computer-readable storage medium of claim 16, wherein the program instructions when executed on the one or more computing devices further cause the one or more computing devices to:

generate the fan control model according to one or more machine learning techniques.

18. The non-transitory computer-readable storage medium of claim 16, wherein the program instructions when executed on the one or more computing devices further cause the one or more computing devices to:

receive, from a building management system, the fan control model;

wherein the building management system coordinates control of a plurality of shared fans mounted in a plurality of racks in a data center.

19. The non-transitory computer-readable storage medium of claim 16, wherein the program instructions when executed on the one or more computing devices further cause the one or more computing devices to:

determine, in response to a change in configuration of one or more electronic devices of the plurality of electronic devices mounted in the rack, an updated fan control model.

20. The non-transitory computer-readable storage medium of claim 19, wherein the program instructions when executed on the one or more computing devices further cause the one or more computing devices to:

subsequent to determining the updated fan control model, provide, to one or more electronic devices mounted in one or more other racks, the updated fan control model.

* * * * *